(12) United States Patent
Strom

(10) Patent No.: US 6,239,665 B1
(45) Date of Patent: May 29, 2001

(54) METHOD AND APPARATUS FOR SWITCHING IN METAL INSULATOR METAL CAPACITORS AND FET TUNING CAPACITORS FOR LOW NOISE OSCILLATORS

(75) Inventor: James David Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/432,673

(22) Filed: Nov. 2, 1999

(51) Int. Cl.$^7$ ...................................................... H03B 5/08
(52) U.S. Cl. ................................ 331/117 FE; 331/117 R; 331/167; 331/177 R; 331/36 C
(58) Field of Search ............................ 331/36 C, 117 FE, 331/177 R, 167; 334/55, 78

(56) References Cited

U.S. PATENT DOCUMENTS

| | | | |
|---|---|---|---|
| 5,084,685 | 1/1992 | Moller et al. | 331/1 A |
| 5,179,991 | 1/1993 | Takashima | 331/1 A |
| 5,625,325 | 4/1997 | Rotzoll et al. | 331/16 |
| 5,721,517 | 2/1998 | Goma et al. | 331/11 R |

*Primary Examiner*—Arnold Kinkead
(74) *Attorney, Agent, or Firm*—Joan Pennington

(57) ABSTRACT

A method and apparatus are provided for switching in metal insulator metal (MIM) capacitors and field effect transistor (FET) tuning capacitors for oscillator circuits. Apparatus for switching in metal-insulator-metal (MIM) capacitors and field effect transistor (FET) tuning capacitors for oscillator circuits includes a first differential oscillator node and a second differential oscillator node. A plurality of metal-insulator-metal (MIM) capacitors are connected to the first differential oscillator nodes and a plurality of metal-insulator-metal (MIM) capacitors are connected to the second differential oscillator nodes. A respective switching transistor is connected in series with an associated one of the metal-insulator-metal (MIM) capacitors. Each switching transistor receives a decoding input and is arranged for providing an open or a ground connection for the associated one of the metal-insulator-metal (MIM) capacitors. A first field effect transistor (FET) tuning capacitor has a gate connected to the first differential oscillator node. A second field effect transistor (FET) tuning capacitor has a gate connected to the second differential oscillator node. Each of the first field effect transistor (FET) tuning capacitor and the second field effect transistor (FET) tuning capacitor having a source and a drain connected together and a control voltage applied to the connected source and drain for varying tuning capacitance.

11 Claims, 5 Drawing Sheets

METHOD AND APPARATUS FOR SWITCHING IN METAL INSULATOR METAL CAPACITORS AND FET TUNING CAPACITORS FOR LOW NOISE OSCILLATORS

FIELD OF THE INVENTION

The present invention relates generally to the oscillator circuits, and more particularly, relates to a method and apparatus for switching in metal insulator metal (MIM) capacitors and field effect transistor (FET) tuning capacitors for oscillator circuits.

DESCRIPTION OF THE RELATED ART

Inductor capacitor (LC) tank oscillators offer superior jitter characteristics. However, the LC tank oscillators have a narrow frequency operating range. This makes it difficult to use LC tank oscillators in microprocessor applications due to the wide range of frequency operation required for debug and hardware base cycle time determination.

A need exists for an effective mechanism to change the range of an oscillator circuit, including LC tank oscillators.

SUMMARY OF THE INVENTION

A principal object of the present invention is to provide a method and apparatus for switching in metal insulator metal (MIM) capacitors and field effect transistor (FET) tuning capacitors for oscillator circuits. Other important objects of the present invention are to provide such method and apparatus for switching in metal insulator metal (MIM) capacitors and field effect transistor (FET) tuning capacitors for oscillator circuits substantially without negative effect and that overcome many of the disadvantages of prior art arrangements.

In brief, a method and apparatus are provided for switching in metal insulator metal (MIM) capacitors and field effect transistor (FET) tuning capacitors for oscillator circuits. Apparatus for switching in metal-insulator-metal (MIM) capacitors and field effect transistor (FET) tuning capacitors for oscillator circuits includes a first differential oscillator node and a second differential oscillator node. A plurality of metal-insulator-metal (MIM) capacitors are connected to the first differential oscillator nodes and a plurality of metal-insulator-metal (MIM) capacitors are connected to the second differential oscillator nodes. A respective switching transistor is connected in series with an associated one of the metal-insulator-metal (MIM) capacitors. Each switching transistor receives a decoding input and is arranged for providing an open or a ground connection for the associated one of the metal-insulator-metal (MIM) capacitors. A first field effect transistor (FET) tuning capacitor has a gate connected to the first differential oscillator node. A second field effect transistor (FET) tuning capacitor has a gate connected to the second differential oscillator node. Each of the first field effect transistor (FET) tuning capacitor and the second field effect transistor (FET) tuning capacitor having a source and a drain connected together and a control voltage applied to the connected source and drain for varying tuning capacitance.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
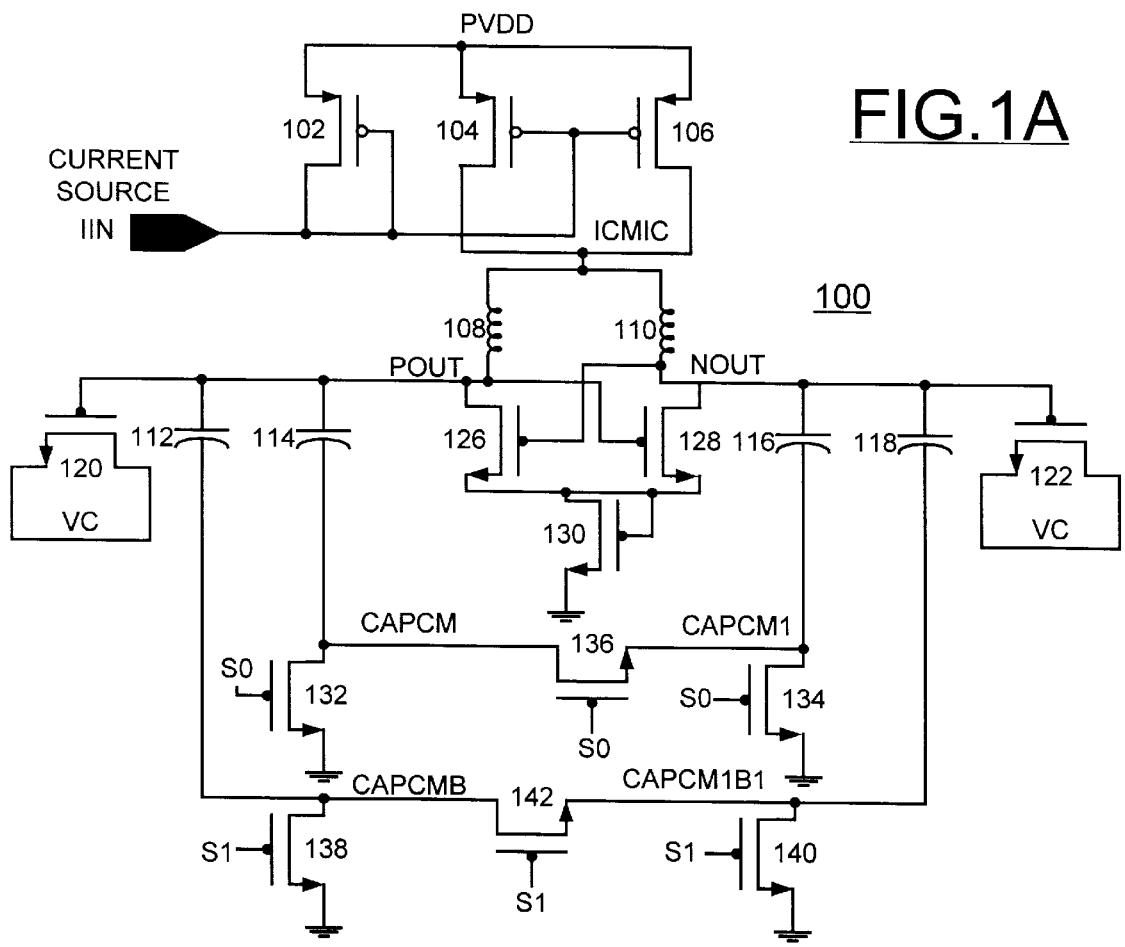
FIG. 1A is a schematic diagram illustrating an oscillator circuit including apparatus switching metal insulator metal (MIM) capacitors and field effect transistor (FET) tuning capacitors in accordance with the preferred embodiment.

Having reference now to the drawings, in FIG. 1A, there is shown an oscillator circuit of the preferred embodiment generally designated by the reference character 100. In accordance with features of the invention, oscillator circuit 100 of the preferred embodiment enables a wide range and good oscillator noise performance.

Oscillator circuit 100 includes a plurality of P-channel field effect transistors (PFETs) 102, 104, and 106, each having a source connected to a supply voltage PVDD. A current source input IIN is connected to the gate of each of the PFETs 102, 104, and 106. Input IIN is connected to the drain of PFET 102. The current in PFET 102 is mirrored in PFETs 104 and 106. A drain of PFETs 104 and 106 is connected to a node ICMIC connected to a pair of inductors 108 and 110. The inductors 108 and 110 are connected between differential signal nodes POUT and NOUT. The capacitance for the tank oscillator includes a plurality of metal-insulator-metal (MIM) parallel plate capacitors 112, 114, 116 and 118 respectively connected to the inductors 108 and 110 at differential signal nodes POUT and NOUT. The metal-insulator-metal (MIM) parallel plate capacitors 112, 114, 116 and 118 are nearly ideal and offer superior Q characteristics to diffusion and/or gate oxide capacitors. A pair of N-well devices, field effect transistor (FET) gate oxide tuning capacitors or accumulation mode FETs 120 and 122 are used to tune the oscillator circuit 100.

As shown in FIG. 1A, oscillator circuit 100 includes a pair of N-channel field effect transistors (NFETs) 126 and 128 respectively having a drain connected to node POUT and node NOUT. A gate of NFET 126 is connected to the drain of NFET 128 at node NOUT. A gate of NFET 128 is connected to the drain of NFET 126 at node POUT. A source of the NFETs 126 and 128 are connected together with a drain and a gate of an NFET 130. A source of NFET 130 is connected to ground.

Oscillator circuit 100 includes a pair of decode inputs S0, S1 and a control voltage VC. Decode input S0 is applied to a gate of a plurality of NFETs 132, 134, and 136. A drain of NFET 132 is connected to the drain of NFET 136 and to capacitor 114. A source of NFET 136 is connected to the drain of NFET 134 and to capacitor 116. A source of both NFETs 132 and 134 is connected to ground. Decode input S1 is applied to a gate of a plurality of NFETs 138, 140, and 142. A drain of NFET 138 is connected to the drain of NFET 142 and to capacitor 112. A source of NFET 142 is connected to the drain of NFET 140 and to capacitor 118. A source of both NFETs 138 and 140 is connected to ground.

The ranges of the oscillator circuit 100 are changed by the decoding inputs S0 and S1 so that the MIM capacitors 112, 114, 116 and 118 are either shorted to ground or open. With logic signal S0 equal to zero, MIM capacitors 114 and 116 are open by FETs 132, 134 and 136 being off with the zero gate input. With logic signal S0 equal to one, MIM capacitors 114 and 116 are shorted to ground with FETs 132, 134 and 136 being on with the high gate input. The oscillator circuit 100 is fully differential at nodes POUT and NOUT. FET 136 allows current flow from node POUT to supply current to node NOUT and similarly allows current flow from node NOUT to supply current to node POUT. The operation of FET 136 keeps the AC signal at nodes CAPCM and CAPCM1 quieter to appear as a virtual ground. Without FET 136, PFETs 132 and 134 would need to be so large to have nodes CAPCM and CAPCM1 appear as a virtual ground that the configuration would not be feasible.

With logic signal S1 equal to zero, MIM capacitors 112 and 118 are open by FETs 138, 140 and 142 being off with the zero gate input. With logic signal S1 equal to one, MIM capacitors 112 and 118 are shorted to ground with FETs 138,140 and 142 being on with the high gate input. FET 142 provides similar operation as PFET 136 keeping the AC signal at nodes CAPCMB and CAPCM1B1 to appear as a virtual ground.

FET gate oxide tuning capacitors 120 and 122 used to tune the oscillator circuit 100 respectively have a gate connected to node POUT and node NOUT. The source and drain of both FET tuning capacitors 120 and 122 are connected together. A control voltage VC is applied to the drain and source of both FET tuning capacitors 120 and 122. As the control voltage VC moves up from ground, the effective gate capacitance varies, varying the frequency of the LC oscillator.

The following TABLE 1 illustrates the LC frequency range for S0, S1 decoding inputs with MIM capacitors 112, 114 and capacitors 116, 118 set to 1 pf and 0.5 pf.

TABLE 1

| S0 | S1 | POUT/NOUT MIM CAPACITANCE | LC OSCILLATOR FREQUENCY RANGE |
|---|---|---|---|
| 0 | 0 | 0 pf | 4.33–3.72 GHz |
| 0 | 1 | 0.5 pf | 3.98–3.48 GHz |
| 1 | 0 | 1.0 pf | 3.56–3.19 GHz |
| 1 | 1 | 1.5 pf | 3.33–3.02 GHz |

Figure 1B:
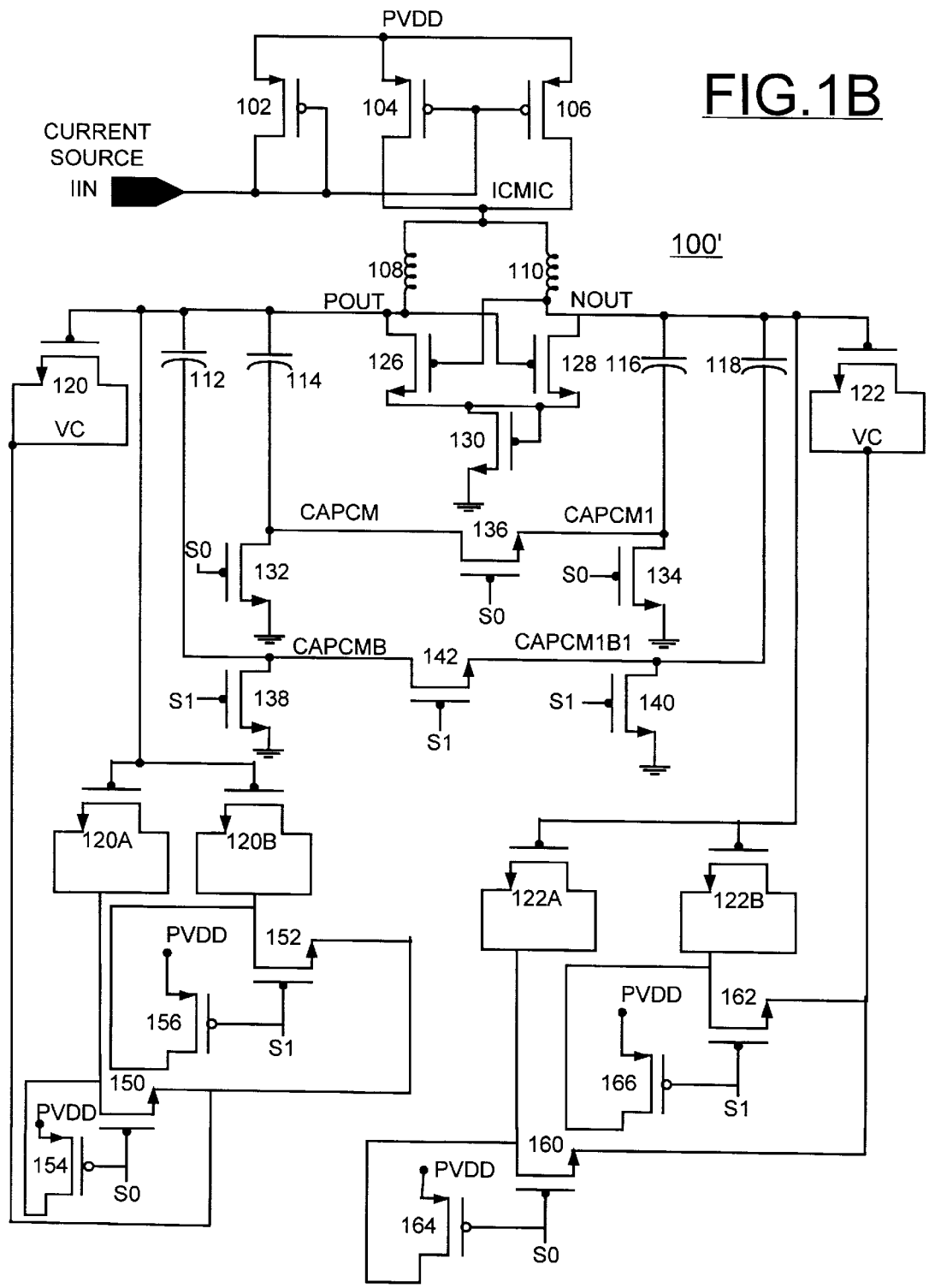
FIG. 1B is a schematic diagram illustrating an alternative oscillator circuit including apparatus switching metal insulator metal (MIM) capacitors and field effect transistor (FET) tuning capacitors in accordance with the preferred embodiment.

Referring now to FIG. 1B, an alternative arrangement of an oscillator circuit 100' is shown. The same reference numbers are used for identical or similar components of oscillator circuit 100 of FIG. 1A. A pair of additional tuning FET capacitors 120A, 120B and 122A, 122B are connected respectively to each of the nodes POUT and NOUT. The source and drain of each FET tuning capacitors 120A, 120B and 122A, 122B are connected together. A gate of each FET tuning capacitor 120A, 120B is connected to node POUT. A gate of each FET tuning capacitor 122A, 122B is connected to node NOUT. A pair of N-channel field effect transistors (NFETs) 150, 152 and a pair on P-channel field effect transistors (PFETs) 154, 156 respectively receive decoding logic signals S0 and S1 applied to a gate. The decoding logic signal S0 is applied to a gate of NFET 150 and PFET 154. NFET 150 is connected between the source and drain of FET tuning capacitor 120A and the control voltage VC. PFET 154 is connected between the supply voltage VPDD and the source and drain of FET tuning capacitor 120A. The source and drain of FET tuning capacitor 120A is connected to the control voltage VC by NFET 150 responsive to a high signal S0. The source and drain of FET tuning capacitor 120A is connected to the supply voltage VPDD by PFET 154 responsive to a low signal S0. The decoding logic signal S1 is applied to a gate of NFET 152 and PFET 156. NFET 152 is connected between the source and drain of FET tuning capacitor 120B and the control voltage VC. PFET 156 is connected between the supply voltage VPDD and the source and drain of FET tuning capacitor 120B. The source and drain of FET tuning capacitor 120B is connected to the control voltage VC by NFET 152 responsive to a high signal S1. The source and drain of FET tuning capacitor 120B is connected to the supply voltage VPDD by PFET 156 responsive to a low signal S1. A pair of N-channel field effect transistors (NFETs) 160, 162 and a pair on P-channel field effect transistors (PFETs) 164, 166 respectively receive decoding logic signals S0 and S1 and are similarly arranged with the FET tuning capacitors 122A, 122B connected to node NOUT.

It has been shown that by adding the additional tuning FET capacitors 120A, 120B and 122A, 122B to nodes POUT and NOUT, the range of operation can be adjusted so that it is more constant over the different ranges. TABLE 2 illustrates operation with the additional tuning FET capacitors 120A, 120B and 122A, 122B.

TABLE 2

| S0 | S1 | POUT/NOUT MIM CAPACITANCE | LC OSCILLATOR FREQUENCY RANGE | DELTA |
|---|---|---|---|---|
| 0 | 0 | 0 pf | 7.6–6.8 GHz | 0.8 GHz |
| 0 | 1 | 0.5 pf | 6.6–5.7 GHz | 0.9 GHz |
| 1 | 0 | 1.0 pf | 5.8–4.9 GHz | 0.8 GHz |
| 1 | 1 | 1.5 pf | 5.4–4.4 GHz | 1.0 GHz |

Figure 2:
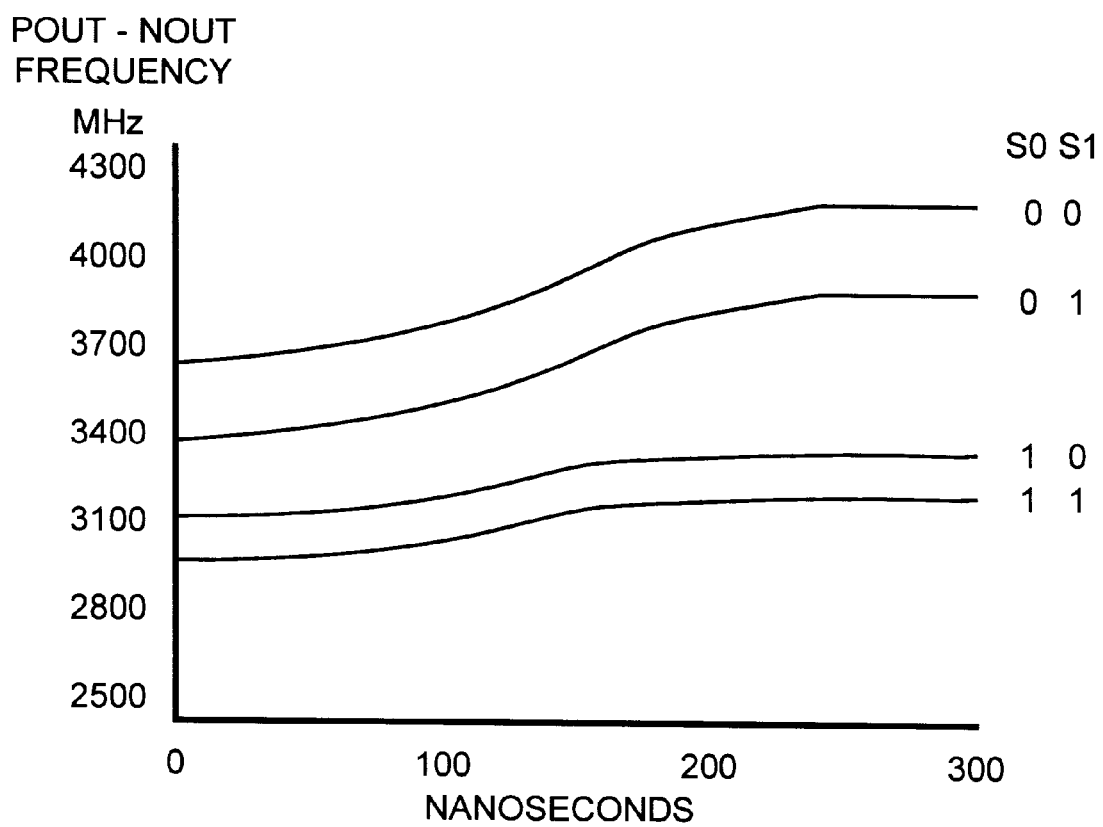
FIG. 2 is a diagram illustrating exemplary operation of the oscillator circuit of FIG. 1A with frequency in MHz shown along the vertical axis, and time in nanoseconds shown along the horizontal axis, as the control voltage VC is swept from 0 to 1 volt over 300 nanoseconds in accordance with the preferred embodiment.

Referring to FIG. 2, there are shown operational results for the oscillator circuit 100. Along the vertical axis, frequency in MHz is shown and along the horizontal axis, time in nanoseconds is shown as the control voltage VC is swept from 0 to 1 volt over 300 nanoseconds.

Figure 3:
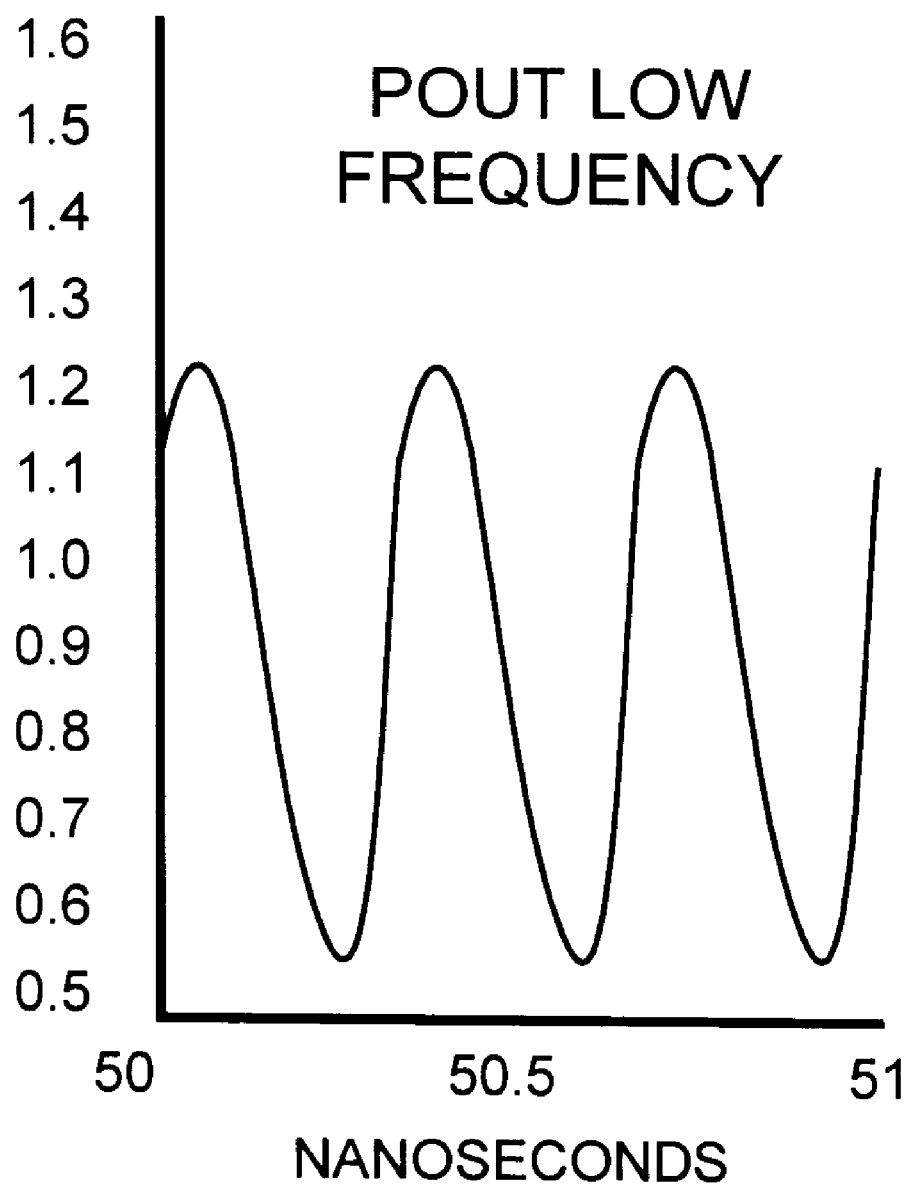
FIG. 3 is a diagram illustrating exemplary operation of the oscillator circuit of FIG. 1A with the oscillator circuit output shown along the vertical axis, and time in nanoseconds shown along the horizontal axis at a lowest frequency of operation in accordance with the preferred embodiment.
Figure 4:
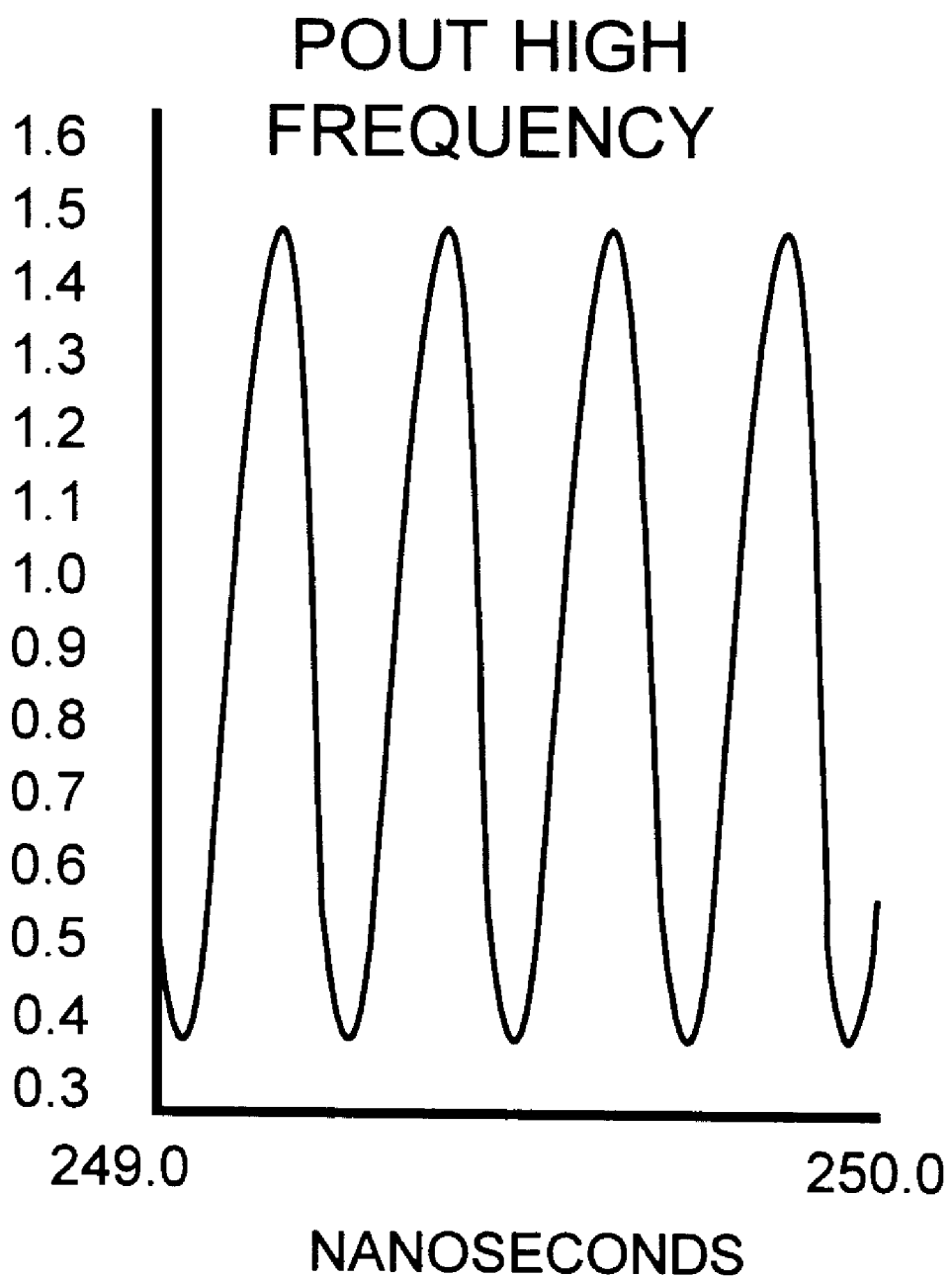
FIG. 4 is a diagram illustrating exemplary operation of the oscillator circuit of FIG. 1A with the oscillator circuit output shown along the vertical axis, and time in nanoseconds shown along the horizontal axis at a highest frequency of operation in accordance with the preferred embodiment.

FIGS. 3 and 4 illustrate the output of the oscillator circuit 100 at the highest and lowest frequencies of operation. The output stays substantially sinusoidal and the amplitude nearly constant throughout the operating range.

While the present invention has been described with reference to the details of the embodiments of the invention shown in the drawing, these details are not intended to limit the scope of the invention as claimed in the appended claims.

What is claimed is:

1. Apparatus for switching in metal-insulator-metal (MIM) capacitors and field effect transistor (FET) tuning capacitors for an oscillator circuit comprising:

a first differential oscillator node and a second differential oscillator node;

a plurality of metal-insulator-metal (MIM) capacitors connected to said first differential oscillator node;

a plurality of metal-insulator-metal (MIM) capacitors connected to said second differential oscillator node;

a respective switching transistor connected in series with an associated one of said metal-insulator-metal (MIM) capacitors; each switching transistor receiving a decoding input and arranged for providing an open or a ground connection for said associated one of said metal-insulator-metal (MIM) capacitors;

a first field effect transistor (FET) tuning capacitor having a gate connected to said first differential oscillator node;

a second field effect transistor (FET) tuning capacitor having a gate connected to said second differential oscillator node; and each of said first field effect transistor (FET) tuning capacitor and said second field effect transistor (FET) tuning capacitor having a source and a drain connected together and a control voltage applied to said connected source and drain for varying tuning capacitance.

2. Apparatus for switching in metal-insulator-metal (MIM) capacitors and field effect transistor (FET) tuning capacitors for an oscillator circuit as recited in claim 1 wherein said switching transistors comprise field effect transistors.

3. Apparatus for switching in metal-insulator-metal (MIM) capacitors and field effect transistor (FET) tuning capacitors for an oscillator circuit as recited in claim 2 wherein each said switching field effect transistor receives said decoding input applied to a gate input.

4. Apparatus for switching in metal-insulator-metal (MIM) capacitors and field effect transistor (FET) tuning capacitors for an oscillator circuit as recited in claim 2 further includes a field effect transistor having a source and a drain connected between a first of said metal-insulator-metal (MIM) capacitors connected to said first differential oscillator node and a second of said metal-insulator-metal (MIM) capacitors connected to said second differential oscillator node.

5. Apparatus for switching in metal-insulator-metal (MIM) capacitors and field effect transistor (FET) tuning capacitors for an oscillator circuit as recited in claim 4 wherein said field effect transistor having said source and said drain connected between said first of said metal-insulator-metal (MIM) capacitors connected to said first differential oscillator node and said second of said metal-insulator-metal (MIM) capaitors connected to said second differential oscillator node receives a gate decoding input equal to a decoding input received by said respective switching transistors connected in series with said first of said metal-insulator-metal (MIM) capacitors connected to said first differential oscillator node and said second of said metal-insulator-metal (MIM) capacitor connected to said second differential oscillator node.

6. Apparatus for switching in metal-insulator-metal (MIM) capacitors and field effect transistor (FET) tuning capacitors for an oscillator circuit as recited in claim 1 wherein said switching transistors comprise N-channel field effect transistors having a drain connected to said associated one of said metal-insulator-metal (MIM) capacitors, a source connected to ground potential and a gate connected to said decoding input.

7. Apparatus for switching in metal-insulator-metal (MIM) capacitors and field effect transistor (FET) tuning capacitors for an oscillator circuit as recited in claim 1 wherein said first field effect transistor (FET) tuning capacitor and said second field effect transistor (FET) tuning capacitor comprise N-channel field effect transistors.

8. Apparatus for switching in metal-insulator-metal (MIM) capacitors and field effect transistor (FET) tuning capacitors for an oscillator circuit as recited in claim 1 wherein said control voltage is adjusted in a range from ground potential to approximately 1 volt.

9. Apparatus for switching in metal-insulator-metal (MIM) capacitors and field effect transistor (FET) tuning capacitors for an oscillator circuit as recited in claim 1 further includes a third field effect transistor (FET) tuning capacitor having a gate connected to said first differential oscillator node; and a fourth field effect transistor (FET) tuning capacitor having a gate connected to said second differential oscillator node.

10. Apparatus for switching in metal-insulator-metal (MIM) capacitors and field effect transistor (FET) tuning capacitors for an oscillator circuit as recited in claim 9 wherein said each of said third field effect transistor (FET) tuning capacitor and said fourth field effect transistor (FET) tuning capacitor having a source and a drain connected together and a voltage selectively applied to said connected source and drain for varying tuning capacitance.

11. A method for switching in metal-insulator-metal (MIM) capacitors and field effect transistor (FET) tuning capacitors for an oscillator circuit comprising the steps of:

providing a plurality of metal-insulator-metal (MIM) capacitors connected to a first differential oscillator node;

providing a plurality of metal-insulator-metal (MIM) capacitors connected to a second differential oscillator node;

connecting a respective switching transistor in series with an associated one of said metal-insulator-metal (MIM) capacitors;

applying a decoding input to said switching transistors; each switching transistor arranged for providing an open or a ground connection for said associated one of said metal-insulator-metal (MIM) capacitors responsive to said decoding input;

connecting a first field effect transistor (FET) tuning capacitor having a gate connected to said first differential oscillator node;

connecting a second field effect transistor (FET) tuning capacitor having a gate connected to said second differential oscillator node; and each of said first field effect transistor (FET) tuning capacitor and said second field effect transistor (FET) tuning capacitor having a source and a drain connected together; and applying a control voltage applied to said connected source and drain of said first field effect transistor (FET) tuning capacitor and said second field effect transistor (FET) tuning capacitor for varying tuning capacitance.

* * * * *